United States Patent
Wang et al.

(10) Patent No.: US 11,353,515 B2
(45) Date of Patent: Jun. 7, 2022

(54) THERMAL RUNAWAY DETECTION CIRCUIT AND METHOD

(71) Applicant: Contemporary Amperex Technology Co., Limited, Ningde (CN)

(72) Inventors: Xiao Wang, Ningde (CN); Chao Zeng, Ningde (CN); Jia Xu, Ningde (CN); Zhimin Dan, Ningde (CN); Yizhen Hou, Ningde (CN); Wei Zhang, Ningde (CN); Guoliang Hu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 362 days.

(21) Appl. No.: 16/559,644

(22) Filed: Sep. 4, 2019

(65) Prior Publication Data

US 2020/0348365 A1 Nov. 5, 2020

(30) Foreign Application Priority Data

Apr. 30, 2019 (CN) .......................... 201910362174.5

(51) Int. Cl.
*G01R 31/392* (2019.01)
*G01R 31/3842* (2019.01)
(Continued)

(52) U.S. Cl.
CPC ........... *G01R 31/392* (2019.01); *G01K 3/005* (2013.01); *G01K 3/10* (2013.01); *G01K 13/00* (2013.01);
(Continued)

(58) Field of Classification Search
None
See application file for complete search history.

(56) References Cited

U.S. PATENT DOCUMENTS

| 4,125,802 A | 11/1978 | Godard |
| 7,433,794 B1 | 10/2008 | Berdichevsky et al. |

(Continued)

FOREIGN PATENT DOCUMENTS

| CN | 101635081 A | 1/2010 |
| CN | 201885823 U | 6/2011 |

(Continued)

OTHER PUBLICATIONS

PCT International Search Report for PCT/CN2020/081427, dated Jul. 1, 2020, 10 pages.

(Continued)

*Primary Examiner* — Jas A Sanghera
(74) *Attorney, Agent, or Firm* — Law Offices of Liaoteng Wang

(57) ABSTRACT

The disclosure provides a thermal runaway detection circuit and method, and relates to batteries. The thermal runaway detection circuit includes: a sensing module including a sensing cable; a detection module connected to the sensing cable and including at least one set of voltage dividing resistors; a processing module connected to the detection module, wherein the processing module is configured to obtain thermal runaway detection data, and determine whether thermal runaway occurs in the battery pack based on the thermal runaway detection data, wherein the thermal runaway detection data includes battery pack data and sampled data collected from sampling points, and the sampling points are disposed between the two connected voltage dividing resistor sets. The technical solutions in the present disclosure can improve safety of the battery pack.

19 Claims, 4 Drawing Sheets

(51) Int. Cl.
  *G01K 3/00* (2006.01)
  *G01K 3/10* (2006.01)
  *G01K 13/00* (2021.01)
  *H01M 10/42* (2006.01)
  *H01M 10/48* (2006.01)
  *H02J 7/00* (2006.01)
(52) U.S. Cl.
  CPC ...... *G01R 31/3842* (2019.01); *H01M 10/425* (2013.01); *H01M 10/48* (2013.01); *H02J 7/0029* (2013.01); *H01M 2010/4271* (2013.01)

(56) References Cited

U.S. PATENT DOCUMENTS

| | | | |
|---|---|---|---|
| 8,864,373 | B2 | 10/2014 | Vu et al. |
| 2002/0036197 | A1 | 3/2002 | Huynh |
| 2006/0255771 | A1* | 11/2006 | Sakakibara ........... H02J 7/0091 320/150 |

FOREIGN PATENT DOCUMENTS

| | | |
|---|---|---|
| CN | 103198602 A | 7/2013 |
| CN | 203305884 U | 11/2013 |
| CN | 203415528 U | 1/2014 |
| CN | 104215823 A | 12/2014 |
| CN | 106114275 A | 11/2016 |
| CN | 106205029 A | 12/2016 |
| CN | 107145173 A | 9/2017 |
| CN | 206584999 U | 10/2017 |
| CN | 107422264 A | 12/2017 |
| CN | 107702801 A | 2/2018 |
| CN | 208157574 U | 11/2018 |
| CN | 208443986 U | 1/2019 |
| CN | 109334514 A | 2/2019 |
| CN | 109364399 A | 2/2019 |
| CN | 109494419 A | 3/2019 |
| EP | 0689275 A1 | 12/1995 |

OTHER PUBLICATIONS

The First Office Action and search report dated Jul. 30, 2020 for Chinese Application No. 201910362174.5, 17 pages.
The extended European search report dated Mar. 25, 2020 for European Application No. 19196066.5, 7 pages.

* cited by examiner

THERMAL RUNAWAY DETECTION CIRCUIT AND METHOD

CROSS REFERENCE TO RELATED APPLICATION

The present application is based upon and claims the benefits of Chinese Patent Application No. 201910362174.5 filed on Apr. 30, 2019, the entire contents of which are incorporated herein by reference.

FIELD

The present disclosure generally relates to batteries, and particularly to a thermal runaway detection circuit and method.

BACKGROUND

With rapid development of new energy sources, new energy sources can provide power for more and more devices. For example, a battery pack can be used as power sources to power new energy vehicles, new energy ships, new energy aircraft, and so on. The battery pack may generate heat during operation. Under normal conditions, the heat generated by the battery packs is controllable. However, under abnormal conditions, such as collision and overcharge, etc., the heat generated by the battery pack is uncontrollable, resulting in thermal runaway. In the event of thermal runaway, a fire may be caused, which may threaten safety of the battery pack, the devices in which the battery pack is installed, and personal safety of the person concerned.

In order to improve the safety of the battery pack, a battery management system (BMS) is currently used to monitor change of voltage or temperature to determine whether thermal runaway occurs. However, in the event of thermal runaway, a circuit board or monitoring unit used to communicate with the BMS may be sputtered and burned by the high-temperature electrolyte generated from the thermal runaway. Therefore, the BMS cannot detect thermal runaway, and the safety of the battery pack is reduced.

SUMMARY

The present disclosure provides a thermal runaway detection circuit and method.

In a first aspect, the present disclosure provides a thermal runaway detection circuit. The thermal runaway detection circuit may include: a sensing module including a sensing cable, wherein a distance between at least a portion of the sensing cable and a cell of a battery pack is less than a temperature sensitive distance threshold; a detection module connected to the sensing cable and including at least one set of voltage dividing resistors, wherein one end of each set of voltage dividing resistors is connected to a first power supply terminal, and the other end of each set of voltage dividing resistors is connected to the ground, and each set of voltage dividing resistors includes at least two voltage dividing resistor sets connected in series; a processing module connected to the detection module, wherein the processing module is configured to obtain thermal runaway detection data, and determine whether thermal runaway occurs in the battery pack based on the thermal runaway detection data, wherein the thermal runaway detection data includes battery pack data and sampled data collected from sampling points, and the sampling points are disposed between the two connected voltage dividing resistor sets.

In a second aspect, the present disclosure provides a thermal runaway detection method for the thermal runaway detection circuit of the first aspect. The method may include: obtaining, by the processing module, thermal runaway detection data; and determining, by the processing module, whether thermal runaway occurs in the battery pack based on the thermal runaway detection data; wherein the thermal runaway detection data includes battery pack data and sampled data collected from sampling points, the sampling points are disposed between the two connected voltage dividing resistor sets.

BRIEF DESCRIPTION OF THE DRAWINGS

The present disclosure can be better understood by reading the following detailed description with reference to the attached drawings, where the same or similar numerals represent the same or similar features.

DETAILED DESCRIPTION

Features of various aspects and exemplary embodiments of the present disclosure will be described in detail below. In the following detailed description, many specific details are disclosed to provide a thorough understanding of the present disclosure. However, it is apparent to a person skilled in the art that the present disclosure may be practiced without some of these specific details. The following descriptions of embodiments are merely to provide a better understanding of the present disclosure through illustrating examples of the present disclosure. The present disclosure is by no means limited to any specific configuration and algorithm disclosed below, but rather covering any modification, substitution, and improvement of elements, components, and algorithms without departing from the spirit of the present disclosure. In the appended drawings and the following descriptions, well-known structures and techniques are not illustrated to avoid unnecessarily obscuring the present disclosure.

Embodiments of the present disclosure provide a thermal runaway detection circuit and method, which may be used in a scenario for monitoring a thermal runaway of a battery pack. The battery pack may include at least one cell. The battery pack may be a battery module, a battery package, or the like, which is not limited herein. In the embodiments of the disclosure, the thermal runaway detection circuit may detect the thermal runaway of the battery pack in time and facilitate corresponding measures in the subsequent process, so as to improve the safety of the battery pack.

Figure 1:
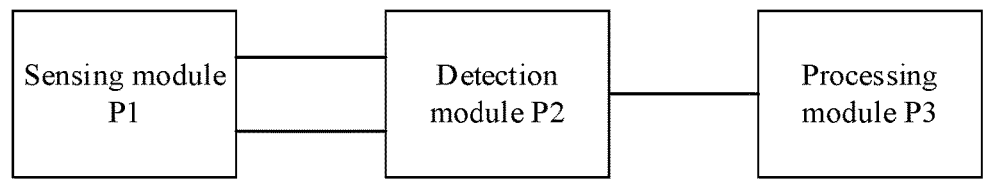
FIG. 1 is a schematic structural diagram of a thermal runaway detection circuit according to an embodiment of the present disclosure.

FIG. 1 is a schematic structure diagram of a thermal runaway detection circuit according to an embodiment of the present disclosure. As shown, the thermal runaway detection circuit may include a sensing module P1, a detection module P2, and a processing module P3.

The sensing module P1 includes a sensing cable. The distance between at least a portion of the sensing cable and a cell of the battery pack is less than a temperature sensitive distance threshold. The number and type of sensing cables may be set according to specific operation scenarios and operation requirements, which is not limited herein.

The temperature sensitive distance threshold is a distance threshold with which the sensing cable is able to sensitively sense that the temperature of a cell in the battery pack is above a temperature threshold. When the distance between the sensing cable and the cell in the battery pack is less than the temperature sensitive distance threshold, the error between the temperature corresponding to the on-off state of the sensing cable being caused to change and the actual temperature of the cell in the battery pack is within an acceptable range. The temperature sensitive distance threshold may be set according to a characteristic parameter of the sensing cable and a characteristic parameter of the cell in combination with the specific operation scenarios and operation requirements, which is not limited herein.

In some examples, when the temperature of the cell is higher than high-temperature temperature threshold, the on-off state of at least a portion of the sensing cable whose distance from the cell is less than the temperature sensitive distance threshold may change, for example, the sensing cable may be open circuited.

In some examples, in order to be able to detect thermal runaway of the battery pack more timely, at least a portion of the sensing cable may be disposed right above a cell explosion-proof valve port of the cell of the battery pack. When thermal runaway occurs in the battery pack, the cell explosion-proof valve port will rupture, and high-temperature electrolyte, high-temperature gas, etc. will be ejected from the explosion-proof valve port of the cell. At least a portion of the sensing cable being disposed right above the cell explosion-proof valve port of the cell of the battery pack may make the sensing cable more sensitive to thermal runaway sensing of the battery pack. As a result, accuracy and timeliness in thermal runaway detection may be further improved.

The detection module P2 is connected to the sensing cable. The detection module P2 includes at least one set of voltage dividing resistors. One end of each set of voltage dividing resistors is connected to a first power supply terminal, and the other end of each set of voltage dividing resistors is connected to the ground. Each set of voltage dividing resistors includes at least two voltage dividing resistors in series.

The first power supply terminal may supply a voltage, for example, a voltage of 5V. If the battery pack and the thermal runaway detection circuit are installed in a power vehicle, the voltage of 5V of the first power supply terminal may be provided by the lead-acid battery in the power vehicle.

A set of voltage dividing resistors includes at least one resistor. If a set of voltage dividing resistors includes a plurality of resistors, the number of resistors and the connection relationship therebetween are not limited herein. The set of voltage dividing resistors is used for voltage division so that the processing module P3 may collect sampled data from sampling points disposed between two connected sets of voltage dividing resistors.

In some examples, the detection module P2 may be specifically disposed in a Battery Management Unit (BMU). The BMU may include a housing structure. The detection module P2 may be protected from the high-temperature electrolyte generated from thermal runaway of the battery pack. Alternatively, the position of the detection module P2 is not specifically limited, and the detection module P2 may be provided with a protective cover to protect the detection module P2 from the high-temperature electrolyte generated from thermal runaway of the battery pack, so as to further ensure the timeliness of the detection of the thermal runaway and the safety of the thermal runaway detection circuit.

The processing module P3 may be connected to the detection module P2. The processing module P3 may be configured to obtain thermal runaway detection data, and determine whether thermal runaway occurs in the battery pack based on the thermal runaway detection data.

The thermal runaway detection data may include battery-pack data and sampled data collected from sampling points which may be disposed between the two connected sets of voltage dividing resistors.

The battery-pack data is data related to the battery pack, which may characterize various states of the battery pack, such as temperature, voltage, faults, and effectiveness of external communications.

The processing module P3 collects sampled data from the sampling points. Specifically, the sampling port may be disposed at the sampling point. The position and number of sampling points can be set according to specific operation scenarios and operation requirements, which are not limited herein. The sampled data may include electrical parameter signals such as voltage, current, etc., which are not limited herein.

According to the sampled data collected from the sampling point, the on-off state of the sensing cable may be determined, that is, the open-circuit or normal path of the sensing cable may be determined. According to the sampled data in combines with the battery pack data, the processing module P3 determine whether thermal runaway occurs in the battery pack to ensure reliability in thermal runaway detection.

In some examples, the processing module P3 may be disposed in the BMU, or functions of the processing module P3 may be integrated into the BMU. For example, the processing module P3 may specifically be a micro control unit (MCU) in the BMU, which is not limited herein.

In an embodiment of the present disclosure, the thermal runaway detection circuit may include the sensing module P1, the detection module P2, and the processing module P3. The sensing module may include a sensing cable, and the distance between at least a portion of the sensing cable and the cell in the battery pack is less than the temperature sensitive distance threshold, such that the state of the sensing cable can be affected by the temperature of the cell in the battery pack. When the sensing cable is affected by the temperature after the thermal runaway of the cell, for example, the high temperature of jet electrolyte after the thermal runaway of the cell, the on-off state of the sensing cable will change, so that the sampled data collected from the sampling points will change. The processing module P3 may detect the thermal runaway in the battery pack in time based on the thermal runaway detection data. As a result, the safety of the battery pack can be improved.

In some examples, the processing module P3 in the above embodiments may be further configured to send an alarm signal to a vehicle controller to trigger the vehicle controller to take measures or remind the person concerned if it is determined that thermal runaway occurs in the battery pack.

In embodiments of the present disclosure, if the thermal runaway detection circuit is installed in the power vehicle, the thermal runaway detection and alarm can still be performed while the whole vehicle of the power vehicle is in the stopped state.

The following describes the specific structure of the thermal runaway detection circuit.

Figure 2:
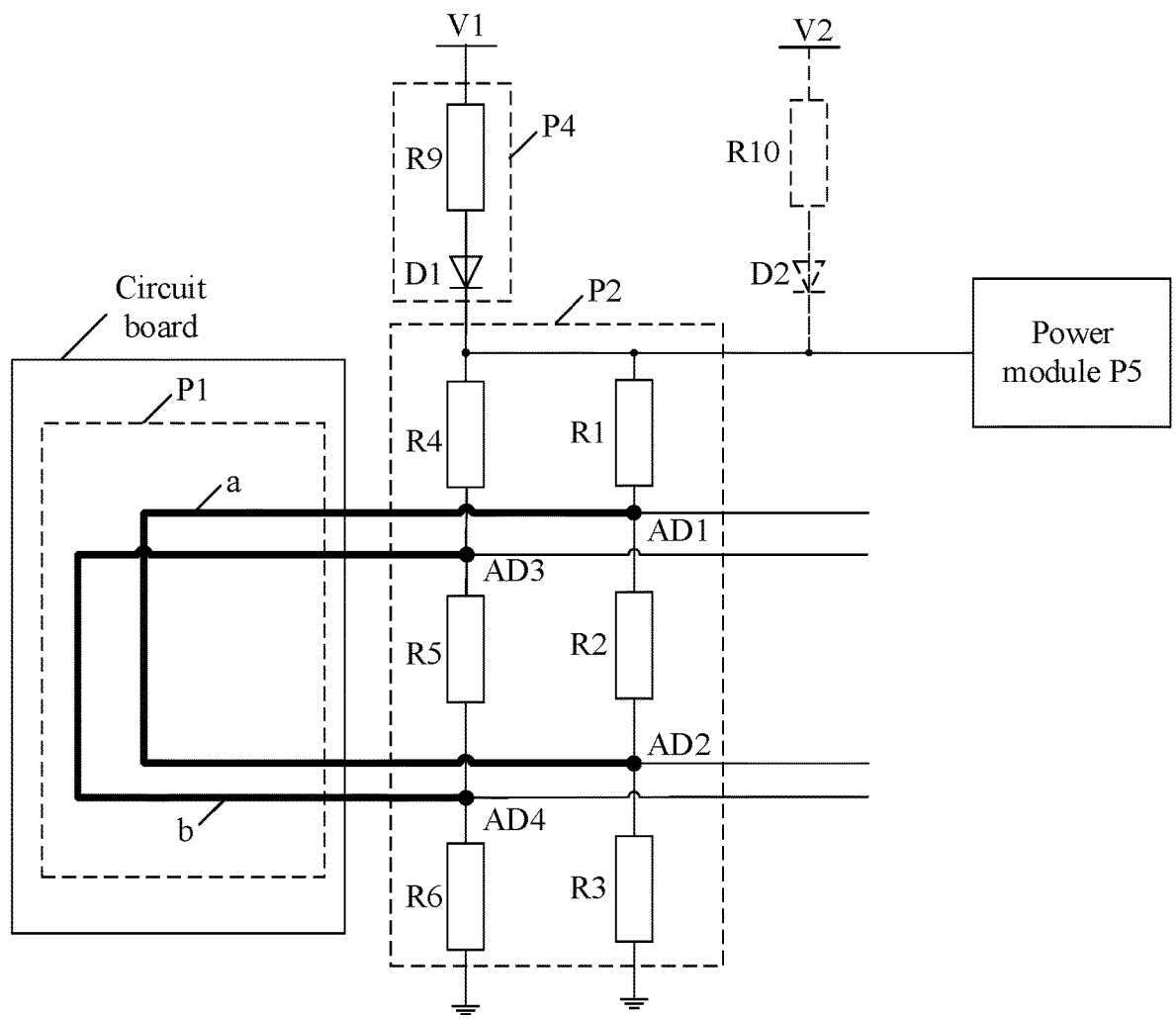
FIG. 2 is a schematic structural diagram of a thermal runaway detection circuit according to another embodiment of the present disclosure.

FIG. 2 is a schematic structure diagram of a thermal runaway detection circuit according to another embodiment of the present disclosure (the processing module P3 is not shown). As shown in FIG. 2, the sensing cable in the detection module P2 may include a first sensing cable and a second sensing cable. The detection module P2 may include two sets of voltage dividing resistors.

The first sensing cable and the second sensing cable may be specifically disposed on a circuit board above the battery pack. The number of circuit boards is not limited. For example, the circuit board may specifically be a flexible printed circuit (FPC), and the first sensing cable and the second sensing cable may be copper wires coated in the FPC substrate, which is different from the sampling cable originally set on the FPC to collect temperature, voltage, etc. The first sensing cable and the second sensing cable are thinner than the sampling cable, that is, a diameter of the first sensing cable and a diameter of the second sensing cable are smaller than a diameter of the sampling cable.

At least a portion of the first sensing cable and at least a portion of the second sensing cable are located right above the cell explosion-proof valve port of the cell of the battery pack. When thermal runaway occurs in the battery pack, the cell explosion-proof valve will rupture, and high-temperature electrolyte, high-temperature gas, etc. will be ejected from the explosion-proof valve port of the cell. At least a portion of the first sensing cable and at least a portion of the second sensing cable being disposed right above the cell explosion-proof valve port of the cell of the battery pack, may make the first sensing cable and the second sensing cable more sensitive to thermal runaway sensing of the battery pack. As a result, accuracy and timeliness in thermal runaway detection may be further improved.

Further, the first sensing cable and the second sensing cable may pass right above the explosion-proof valve port of all the cells of the battery pack. The specific arrangement of the first sensing cable and the second sensing cable may also be determined in combination with the internal structure of the battery pack. For example, the battery pack is a battery set, the battery set includes a plurality of battery units, and a plurality of circuit boards may be disposed in the battery pack. The first sensing cable may include a plurality of sensing cable segments, each sensing cable segment being disposed on one circuit board, and each sensing cable segment may be connected by other wiring harnesses or connectors or the like. The arrangement of the second sensing cable may be referred to the first sensing cable, and details are not repeated herein again.

In the embodiments of the present disclosure, the sampling point includes a first sampling point, a second sampling point, a third sampling point, and a fourth sampling point.

The first set of voltage dividing resistors includes a first voltage dividing resistor set, a second voltage dividing resistor set, and a third voltage dividing resistor set in series. One end of the first voltage dividing resistor set is connected to the first power supply terminal. One end of the third voltage dividing resistor set is connected to the ground.

For example, as shown in FIG. 2, the first voltage dividing resistor set includes a resistor R1, the second voltage dividing resistor set includes a resistor R2, and the third voltage dividing resistor set includes a resistor R3. One end of the resistor R1 is connected to the first power supply terminal V1, and the other end of the resistor R1 is connected to one end of the resistor R2. The other end of the resistor R2 is connected to the other end of the resistor R3. One end of the resistor R3 is connected to the ground.

The first sampling point is disposed between the first voltage dividing resistor set and the second voltage dividing resistor set. The second sampling point is disposed between the second voltage dividing resistor set and the third voltage dividing resistor set. One end of the first sensing cable is connected to the first sampling point, and the other end of the first sensing cable is connected to the second sampling point.

For example, as shown in FIG. 2, the first sampling point is labeled as AD1 and the second sampling point is labeled as AD2. The first sampling point AD1 is disposed between the resistor R1 and the resistor R2, and the second sampling point AD2 is disposed between the resistor R2 and the resistor R3. The first sensing cable is labeled with a, and the first sensing cable a is equivalent to being connected in parallel with the resistor R2.

The second set of voltage dividing resistors includes a fourth voltage dividing resistor set, a fifth voltage dividing resistor set, and a sixth voltage dividing resistor set in series. One end of the fourth voltage dividing resistor set is connected to the first power supply terminal. One end of the sixth voltage dividing resistor set is connected to the ground.

For example, as shown in FIG. 2, the fourth voltage dividing resistor set includes a resistor R4, the fifth voltage dividing resistor set includes a resistor R5, and the sixth voltage dividing resistor set includes a resistor R6. One end of the resistor R4 is connected to the first power supply terminal V1, and the other end of the resistor R4 is connected to one end of the resistor R5. The other end of the resistor R5 is connected to the other end of the resistor R6. One end of the resistor R6 is connected to the ground.

The third sampling point is disposed between the fourth voltage dividing resistor set and the fifth voltage dividing resistor set. The fourth sampling point is disposed between the fifth voltage dividing resistor set and the sixth voltage dividing resistor set. One end of the second sensing cable is connected to the third sampling point, and the other end of the second sensing cable is connected to the fourth sampling point.

For example, as shown in FIG. 2, the third sampling point is labeled as AD3 and the fourth sampling point is labeled as AD4. The third sampling point AD3 is disposed between the resistor R4 and the resistor R5, and the fourth sampling point AD4 is disposed between the resistor R5 and the resistor R6. The second sensing cable is labeled with b, and the second sensing cable b is equivalent to being connected in parallel with the resistor R5.

If the first sensing cable a is not open circuited, the circuit from the first power supply terminal V1 to the ground through the first set of voltage dividing resistors is: the first power supply terminal V1→the resistor R1→the first sensing cable a→the resistor R3→ground.

If the first sensing cable a is open circuited, the circuit for the first power supply terminal V1 to the ground through the first set of voltage dividing resistors is: the first power supply terminal V1→the resistor R1→the resistor R2→the resistor R3→ground.

Similarly, if the second sensing cable b is not open circuited, the circuit from the first power supply terminal V1 to the ground through the second set of voltage dividing resistors is: the first power supply terminal V1→the resistor R4→the second sensing cable b→the resistor R6→ground.

If the second sensing cable b is open circuited, the circuit from the first power supply terminal V1 to the ground through the second set of voltage dividing resistors is: the first power supply terminal V1→the resistor R4→the resistor R5→the resistor R6→ground.

Therefore, when the first sensing cable a is open circuited or not open circuited, the first sampled data collected from the first sampling point AD1 and the second sampled data collected from the second sampling point AD2 are different, and an on-off state of the first sensing cable a may be determined based on the first sampled data and the second sampled data. The on-off state includes an open circuit and a non-open circuit (i.e., a normal path).

Similarly, when the second sensing cable b is open circuited or not open circuited, the third sampled data collected from the third sampling point AD3 and the fourth sampled data collected from the fourth sampling point AD4 are different, and an on-off state of the second sensing cable b may be determined based on the third sampled data and the fourth sampled data determine. The on-off state includes an open circuit and non-open circuit (i.e., a normal path).

The processing module P3 may be configured to: obtain a first sampled data, a second sampled data, a third sampled data, and a fourth sampled data from the first sampling point, the second sampling point, the third sampling point, and the fourth sampling point respectively; determine an on-off state of the first sensing cable based on the first sampled data and the second sampled data; determine an on-off state of the second sensing cable based on the third sampled data and the fourth sampled data; and determine whether thermal runaway occurs in the battery pack based on the on-off state of the first sensing cable and the on-off state of the second sensing cable.

In some examples, a first open-circuit threshold range and a second open-circuit threshold range for determining that the first sensing cable is open circuited, and a third open-circuit threshold range and a fourth open-circuit threshold range for determining that the second sensing cable is open circuited may be preset.

In some examples, a first normal path threshold range and a second normal path threshold range for determining the first sensing cable is a normal path, and a third normal path threshold range and a fourth normal path for determining the second sensing cable is a normal path may also be preset.

The first open-circuit threshold range and the second open-circuit threshold range are related to a voltage provided by the first power supply terminal, a first voltage dividing resistor set, a second voltage dividing resistor set, a third voltage dividing resistor set, and an acceptable error range. That is to say, the first open-circuit threshold range and the second-open circuit threshold range may be calculated based on the voltage provided by the first power supply terminal, the first voltage dividing resistor set, the second voltage dividing resistor set, the third voltage dividing resistor set, and the acceptable error range.

The third open-circuit threshold range and the fourth open-circuit threshold range are related to a voltage provided by the first power supply terminal, a fourth voltage dividing resistor set, a fifth voltage dividing resistor set, a sixth voltage dividing resistor set, and an acceptable error range. That is to say, the third open-circuit threshold range and the fourth open-circuit may be calculated based on the voltage supplied by the first power supply terminal, the fourth voltage dividing resistor set, the fifth voltage dividing resistor set, the sixth voltage dividing resistor set, and the acceptable error range.

The first path threshold range and the second path threshold range are related to a voltage provided by the first power supply terminal, a first voltage dividing resistor set, a third voltage dividing resistor set, and an acceptable error range. That is to say, the first path threshold range and the second path threshold range may be calculated based on the voltage provided by the first power supply terminal, the first voltage dividing resistor set, the third voltage dividing resistor set, and the acceptable error range.

The third path threshold range and the fourth path threshold range are related to a voltage provided by the first power supply terminal, a fourth voltage dividing resistor set, a sixth voltage dividing resistor set, and an acceptable error range. That is to say, the third path threshold range and the fourth path threshold range may be calculated based on the voltage provided by the first power supply terminal, the fourth voltage dividing resistor set, the sixth voltage dividing resistor set, and the acceptable error range.

It should be noted that the first path threshold range may be the same as the second path threshold range may be the same, or the deviation between the first path threshold range and the second path threshold range is within an acceptable range. The third path threshold range may be the same as the fourth path threshold range, or the deviation between the third path threshold range and the fourth path threshold range is within an acceptable range.

The processing module P3 may be configured to: determine that the first sensing cable is open circuited when the first sampled data is in the first open-circuit threshold range, and the second sampled data is in the second open-circuit threshold range; determine that the second sensing cable is open circuited when the third sampled data is within the third open-circuit threshold range, and the fourth sampled data is within the fourth open-circuit threshold range; and determine thermal runaway occurs in the battery pack when the first sensing cable and the second sensing cable are both open circuited, and at least one parameter of the battery pack data satisfies the fault condition within the preset period.

The battery pack data includes at least one parameter. Parameters can be used to characterize various states of the battery pack, such as temperature, voltage, faults, and effectiveness of external communications.

In some examples, the battery pack data may specifically be various types of battery related parameters, for example, one or more parameters of the maximum temperature of a cell in a battery pack, the temperature change rate of a cell in the battery pack, the difference between the maximum temperature of a cell in the battery pack and the minimum temperature of a cell in the battery pack, the minimum voltage of a cell in the battery pack, the number of voltage sampling open-circuit faults of the battery pack, the temperature sensing failure parameter, and the cell monitoring communication failure parameter, which are not limited herein.

The fault condition may include a parameter exceeding the safety parameter threshold range or a parameter characterizing a failure. The fault conditions may be set according to specific operation scenarios and operation requirements, which is not limited herein. Setting of the preset period can effectively avoid at least a part misjudgment for the thermal runaway and improve the reliability of the thermal runaway detection.

Corresponding to each parameter in the battery pack data, there are different safety parameter threshold ranges. The safety parameter threshold range corresponding to the maximum temperature of a cell in the battery pack may specifically be a maximum temperature safety threshold range. The safety parameter threshold range corresponding to the temperature change rate of a cell in the battery pack may specifically be a temperature change rate safety threshold range. The safety parameter threshold range corresponding to the difference between the maximum temperature and the minimum temperature of a cell in the battery pack may specifically be a temperature difference safety threshold range. The safety parameter threshold range corresponding to the minimum voltage of a cell in the battery pack may specifically be a minimum voltage safety threshold range. The safety parameter threshold range corresponding to the number of voltage sampling open-circuit faults of the battery pack may specifically be a fault data safety threshold range.

The temperature sensing failure parameter may characterize whether the sensor or sensing component used for temperature sensing fails. For example, a negative temperature coefficient (NTC) thermistor may be provided in the battery pack, and the temperature sensing failure parameter may indicate whether the NTC thermistor disposed in the battery pack fails completely.

The cell monitoring communication failure parameter may characterize whether a communication between the component that monitors the cell and the BMU fails (i.e., whether the communication is lost). For example, the cell of the battery pack may be equipped with a Cell Supervision Circuit (CSC), and the cell monitoring communication failure parameter may indicate whether the communication between the CSC and the BMU fails.

For example, following several examples of determination of the thermal runaway of the battery pack are provided in the case of determining that the first sensing cable and the second sensing cable are open circuited. However, it should be noted that the determination of the thermal runaway of the battery pack may include, but is not limited to, the following examples.

Example 1: if it is determined that the first sensing cable and the second sensing cable are open circuited within 10 minutes, and the maximum temperature of a cell in the battery pack is greater than 68.4° C. for 2 seconds, it can be determined that thermal runaway occurs in the battery pack.

Example 2: if it is determined that the first sensing cable and the second sensing cable are open circuited within 10 minutes, and the temperature change rate of a cell in the battery pack is greater than 3° C./second for 2 seconds, it can be determined that thermal runaway occurs in the battery pack.

Example 3: if it is determined that the first sensing cable and the second sensing cable are open circuited within 10 minutes, and the difference between the maximum temperature and the minimum temperature of a cell in the battery pack is greater than 30° C., it can be determined that thermal runaway occurs in the battery pack.

Example 4: if it is determined that the first sensing cable and the second sensing cable are open circuited within 10 minutes, and the minimum voltage of a cell in the battery is less than 2V for 300 milliseconds, it can be determined that thermal runaway occurs in the battery pack.

Example 5: if it is determined that the first sensing cable and the second sensing cable are open circuited within 10 minutes, and the number of voltage sampling open-circuit faults of the battery pack is greater than or equal to 1, it can be determined that thermal runaway occurs in the battery pack.

Example 6: if it is determined that the first sensing cable and the second sensing cable are open circuited within 10 minutes, and the temperature sensing failure parameter may indicate that the NTC thermistor disposed in the battery pack fails completely, it can be determined that thermal runaway occurs in the battery pack.

Example 7: if it is determined that the first sensing cable and the second sensing cable are open circuited within 10 minutes, and the cell monitoring communication failure parameter may characterize that the communication between the CSC and the BMU fails, it can be determined that thermal runaway occurs in the battery pack.

In other examples, the processing module P3 may be configured to: determine thermal runaway occurs in the battery pack when it is determined that at least one sensing cable of the first sensing cable and the second sensing cable is not open circuited, and at least one set of parameters in the battery pack data satisfies the fault condition within a preset period.

It is determined that at least one sensing cable of the first sensing cable and the second sensing cable is open circuited, specifically, only one of the first sensing cable and the second sensing cable is open circuited, or specifically, the first sensing cable and the second sensing cable are both not open circuited.

A set of parameters includes at least two parameters. A set of parameters includes, but is not limited to, any of the following sets of parameters:

The first set: the minimum voltage of a cell in the battery pack, and the maximum temperature of a cell in the battery pack.

The second set: the minimum voltage of a cell in the battery pack, and the temperature change rate of a cell in the battery pack.

The third set: the minimum voltage of a cell in the battery pack, and the temperature change rate of a cell in the battery pack.

The fourth set: the temperature change rate of a cell in the battery pack, and the maximum temperature of a cell in the battery pack.

The fifth set: the temperature change rate of a cell in the battery pack, and the difference between the maximum temperature of a cell in the battery pack and the minimum temperature of a cell in the battery pack.

The sixth set: the number of voltage sampling open-circuit faults of the battery pack, and the maximum temperature of a cell in the battery pack.

The seventh set: the number of voltage sampling open-circuit faults of the battery pack, and the temperature change rate of a cell in the battery pack.

The eighth set: the number of voltage sampling open-circuit faults of the battery pack, and the difference between the maximum temperature of a cell in the battery pack and the minimum temperature of a cell in the battery pack.

The ninth set: the number of voltage sampling open-circuit faults of the battery pack, and the temperature sensing failure parameter.

The specific parameters in each of the above parameters and related content may be referred to the related descriptions in the above embodiments, and details are not described herein again. The fault condition may include a parameter exceeding the safety parameter threshold range or a parameter characterizing a failure.

For example, as an example, a plurality sets of parameters and their corresponding fault conditions are listed below. If at least one set of parameters meets its corresponding fault condition, it can be determined that thermal runaway occurs in the battery pack. At least two parameters satisfying its corresponding fault condition may further improve the reliability of the thermal runaway detection. It should be noted that the parameters and fault conditions in the embodiments of the present disclosure may include, but be not limited to, the following parameters and fault conditions.

The first set of parameters and corresponding fault conditions: the minimum voltage of a cell in the battery pack is less than 2V for 300 milliseconds, and the maximum temperature of a cell in the battery pack is greater than 68° C. for 2 seconds.

The second set of parameters and corresponding fault conditions: the minimum voltage of a cell in the battery pack is less than 2V for 300 milliseconds, and the temperature change rate of a cell in the battery pack is greater than 3° C./second for 2 seconds.

The third set of parameters and corresponding fault conditions: the minimum voltage of a cell in the battery pack is less than 2V for 300 milliseconds, and the difference between the maximum temperature and the minimum temperature of a cell in the battery pack is greater than 30° C.

The fourth set of parameters and corresponding fault conditions: the temperature change rate of a cell in the battery pack is greater than 3° C./second for 2 seconds, and the maximum temperature of a cell in the battery pack is greater than 68° C. for 2 seconds.

The fifth set of parameters and corresponding fault conditions: the temperature change rate of a cell in the battery pack is greater than 3° C./second for 2 seconds, and the difference between the maximum temperature and the minimum temperature of a cell in the battery pack is greater than 30° C.

The sixth set of parameters and corresponding fault conditions: the number of voltage sampling open-circuit faults of the battery pack is greater than or equal to 1, and the maximum temperature of a cell in the battery pack is greater than 68° C. for 2 seconds.

The seventh set of parameters and corresponding fault conditions: the number of voltage sampling open-circuit faults of the battery pack is greater than or equal to 1, and the temperature change rate of a cell in the battery pack is greater than 3° C./second for 2 seconds.

The eighth set of parameters and corresponding fault conditions: the number of voltage sampling open-circuit faults of the battery pack is greater than or equal to 1, and the difference between the maximum temperature and the minimum temperature of a cell in the battery pack is greater than 30° C.

The ninth set of parameters and corresponding fault conditions: the number of voltage sampling open-circuit faults of the battery pack is greater than or equal to 1, and the temperature sensing failure parameter characterizes that the NTC thermistor disposed in the battery pack completely fails.

If at least one set of the above nine sets of parameters satisfies corresponding fault conditions, it may be determined that thermal runaway occurs in the battery pack.

In still another example, if it is determined that only one of the first sensing cable and the second sensing cable is open circuited, it may be determined that there is not a fault at the battery pack, and no fault handling is performed.

It should be noted that if the first sampled data is neither within the first open-circuit threshold range nor within the first path threshold range, it may be determined that there is a fault at the sampling port of the first sampling point. If the second sampled data is neither within the second open-circuit threshold range nor within the second path threshold range, it may be determined that there is a fault at the sampling port of the second sampling point. If the third sampled data is neither within the third open-circuit threshold range nor within the third path threshold range, it may be determined that there is a fault at the sampling port of the third sampling point. If the fourth sampled data is neither within the fourth open-circuit threshold range nor within the fourth path threshold range, it may be determined that there is a fault at the sampling port of the fourth sampling point.

If it is determined that there is a fault at the sampling port of the sampling point, a prompt message about sampling fault may be sent to prompt the vehicle controller to take corresponding measures or prompt the persons related.

In some examples, the processing module P3 is further configured to: send a thermal runaway warning message when it is determined that at least one of the first sensing cable and the second sensing cable is not open circuited and the battery pack data satisfies the fault condition.

The battery pack data includes the maximum voltage of a cell in the battery pack during charging, the actual state of charge of the battery pack during charging, and the charging current of the battery pack during charging. Fault conditions include a parameter that exceed the safety parameter threshold range.

Corresponding to the specific parameters of the battery pack data, the safety parameter threshold range includes a voltage safety parameter threshold range, a state of charge safety parameter threshold range, and a current safety parameter threshold range.

That is to say, if it is determined that at least one of the first sensing cable and the second sensing cable is not open circuited, the maximum voltage of a cell in the battery pack during charging exceeds a voltage safety parameter threshold range, the actual state of charge of the battery pack during charging exceeds a state of charge safety parameter threshold range, and the charging current of the battery pack during charging exceeds a current safety parameter threshold range, it may be predicted that thermal runaway is about to occur in the battery pack. The thermal runaway warning message may be sent, so that corresponding measures can be taken in advance to avoid thermal runaway and further improve the safety of the battery pack.

For example, during the charging, if the maximum voltage of a cell in the battery pack is greater than 1.1 times the tertiary overvoltage threshold, the actual state of charge of the battery pack is greater than 115%, and the charging current is greater than or equal to 0.33 times the rated charge current under one-hour-rate, it may be predicted that thermal runaway is about to occur in the battery pack. Then the thermal runaway warning message may be sent.

In some embodiments, the state of the BMU includes an operating state and a sleep state. When the BMU is in the operating state, the power module P5 of the BMU controls the power supply module of the BMU to power on, so that the BMU is in the operating state, can perform data monitoring on the battery pack normally, such as voltage monitoring, current monitoring, temperature monitoring, insulation monitoring, and state of charge monitoring, etc., and can obtain voltage, current, temperature, state of charge, etc. as thermal runaway detection data. When the BMU is in the sleep state, the power module of the BMU controls the power module of the BMU to power off. The BMU stops monitoring the battery pack the data. The power module P5 can be implemented as a power chip, such as a system base chip (SBC), which is not limited herein.

If thermal runaway occurs in the battery pack in the process of the BMU being in the sleep state, the BMU stops data monitoring and cannot provide thermal runaway detection data. If a function of the processing module P3 is integrated in the BMU and the BMU is in the sleep state, detection and determination of thermal runaway cannot be carried out.

Figure 3:
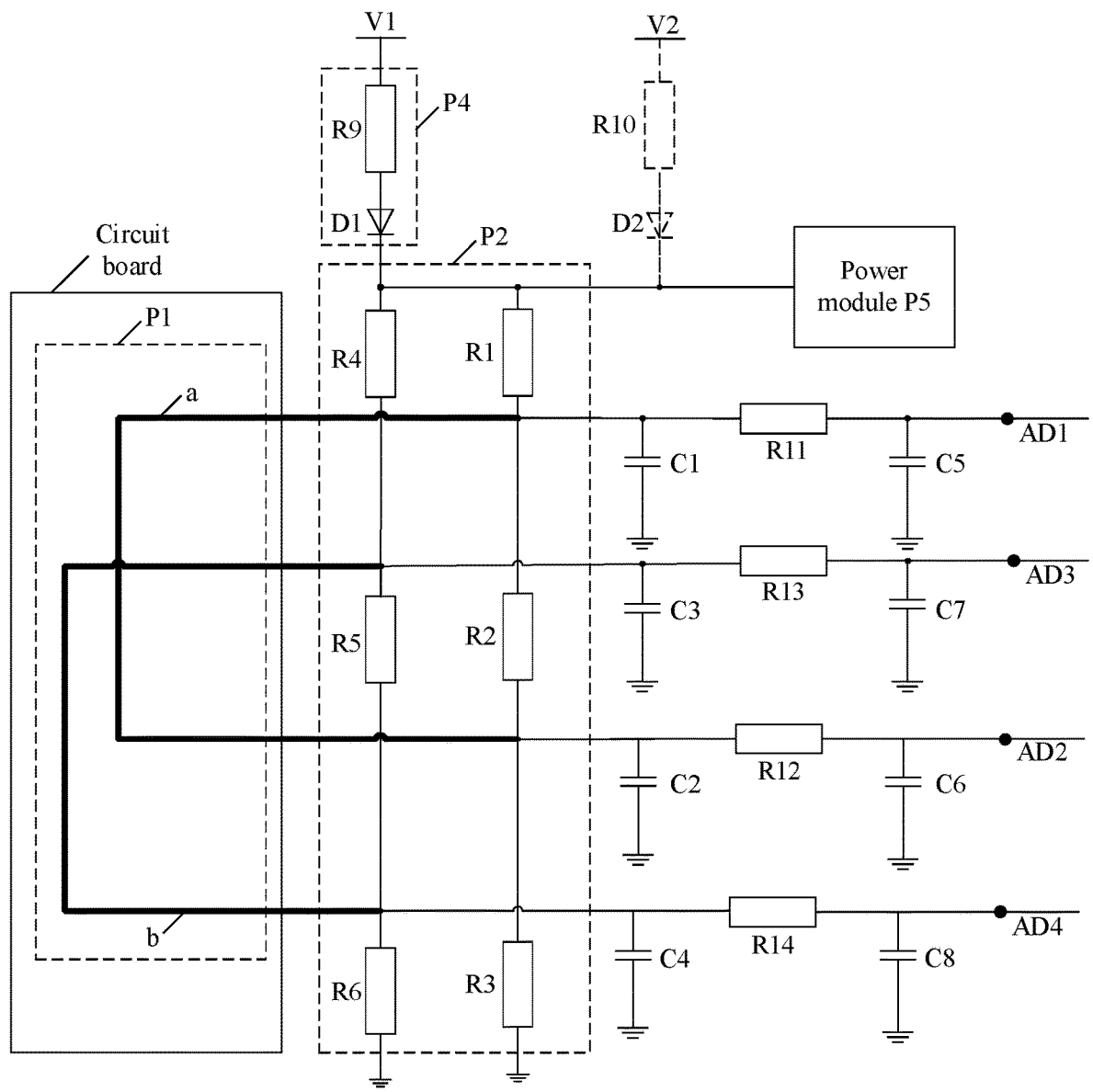
FIG. 3 is a schematic structural diagram of a thermal runaway detection circuit according to still another embodiment of the present disclosure.

In the process of the BMU being in a sleep state, the thermal runaway detection may also be performed, and the thermal runaway detection data may be obtained in the thermal runaway detection process. FIG. 3 is a schematic structural diagram of a thermal runaway detection circuit according to still another embodiment of the present disclosure (processing module P3 is not shown). The sleep-wakeup module P4 shown in FIG. 2 and FIG. 3 can wake up the BMU, when thermal runaway may occurs, and thermal runaway detection is required for the BMU being in the sleep state. The difference between FIG. 3 and FIG. 2 is that the detection module P2 in the thermal runaway detection circuit shown in FIG. 3 may further include some protection devices and/or filter components. The protection device may specifically include a protection capacitor, and the filter component may specifically include a filter capacitor and a filter resistor.

The sleep-wakeup module P4 is disposed between the first power supply terminal and all of voltage dividing resistor sets, and the sleep-wakeup module P4 is configured to send a control signal to the power module P5 of the battery management unit when the battery management unit is in the sleep state.

The control signal is used to instruct the power module P5 to control the battery management unit to remain in a sleep state or switch to an operating state. For example, if the voltage of the control signal is higher than or equal to the threshold voltage of the power module P5, that is, the control signal controls the BMU to switch to the operating state, the BMU is woken up. If the voltage of the control signal is lower than the startup voltage threshold of the power module P5, that is, the control signal controls the BMU to remain in the sleep state, the BMU is not woken up.

In some examples, the sleep-wakeup module P4 includes a ninth voltage dividing resistor set. Alternatively, the sleep-wakeup module P4 includes a ninth voltage dividing resistor set and a diode. The diode is disposed between the ninth voltage dividing resistor set and the power module P5. Specifically, the anode of the diode is connected to the ninth voltage dividing resistor set, and the cathode of the diode is connected to the power module P5.

For example, as shown in FIG. 3, the sleep-wakeup module P4 includes a ninth voltage dividing resistor set and a diode. The ninth voltage dividing resistor set includes a resistor R9. One end of the resistor R9 is connected to the first power supply terminal V1, and the other end of the resistor R9 is connected to the anode of the diode D1. The cathode of the diode D1 is connected to the power module P5, one end of the resistor R1, and one end of the resistor R4.

It should be noted that if the BMU is in the operating state, the second power supply terminal continuously provides an operating signal to the power module P5 of the BMU. The second power supply is powered up when the BMU is in operation state, thereby ensuring continuously providing the operating signal to the BMU. The second power supply is powered off when the BMU is in the sleep state, and the sleep-wakeup module P4 wakes up the BMU. As shown in FIG. 3, a resistor R10 may be disposed between the second power supply terminal V2 and the power module P5 of the BMU. A diode D2 may also be disposed between the resistor R10 and the power module P5. The anode of the diode D2 is connected to the resistor R10, and the cathode of the diode D2 is connected to the power module P5. Both the diode D1 and the diode D2 may prevent current from flowing back, and the diode D1 and the diode D2 also have a function of competing power supply. For example, if the voltage supplied by the second power supply terminal V2 is higher than the voltage provided by the first power supply terminal V1, the second power supply terminal V2 can ensure that the BMU is continuously in the operating state when the BMU is in the operating state.

The value of the voltage provided by the second power supply terminal V2 and the value of the voltage supplied by the first power supply terminal V1 may be the same or different, which are not limited herein. For example, the voltage supplied by the second power supply terminal V2 is 12V.

It is worth mentioning that if the thermal runaway detection circuit includes the sleep-wakeup module P4, the sleep-wakeup module P4 includes a ninth voltage dividing resistor set. The first open-circuit threshold range, the second open-circuit threshold range, the third open-circuit threshold range, the fourth open-circuit threshold range, the first path threshold range, the second path threshold range, the third path threshold range, and the fourth path threshold range in the above embodiments may also be related to the ninth voltage dividing resistor set. If the sleep-wakeup module P4 further includes a diode, the first open-circuit threshold range, the second open-circuit threshold range, the third open-circuit threshold range, the fourth open-circuit threshold range, the first path threshold range, the second path threshold range, The third path threshold range and the fourth path threshold range in the above embodiments are also related to the diode.

In some examples, if the voltage provided by the second power supply terminal is higher than the first power supply terminal, the first open-circuit threshold range, the second open-circuit threshold range, the third open-circuit threshold range, the fourth open-circuit threshold range, and the first path threshold range, the second path threshold range, the third path threshold range, and the fourth path threshold range may also be related to a resistor and a diode between the second power supply terminal and the power supply module P5.

One end of the protection capacitor is connected to one end of the voltage dividing resistor set connected to the sampling point, and the other end of the protection capacitor is connected to the ground. The protection capacitor prevents Electrostatic Discharge (ESD) from occurring in the thermal runaway detection circuit.

The sampling points include a first sampling point, a second sampling point, a third sampling point, and a fourth sampling point. Correspondingly, the protection capacitor may include a first protection capacitor, a second protection capacitor, a third protection capacitor, and a fourth protection capacitor. As shown in FIG. 3, one end of the first protection capacitor C1 is connected to one end of the resistor R1 connected to the first sampling point AD1, and one end of the second protection capacitor C2 is connected to one end of the resistor R2 and the second sampling point AD2. One end of the protection capacitor C3 is connected to one end of the resistor R4 connected to the third sampling point AD3, and one end of the fourth protection capacitor C4 is connected to one end of the resistor R5 and the fourth sampling point AD4. The other ends of the first protection capacitor C1, the second protection capacitor C2, the third protection capacitor C3, and the fourth protection capacitor C4 are connected to the ground.

The detection module P2 further includes a filter capacitor and a filter resistor. One end of the filter capacitor is connected to one end of the filter resistor and the sampling point, and the other end of the filter capacitor is connected to the ground. The other end of the filter resistor is connected to one end of the protection capacitor.

The sampling points include a first sampling point, a second sampling point, a third sampling point, and a fourth sampling point. Correspondingly, the filter capacitors may include a first filter capacitor C5, a second filter capacitor C6, a third filter capacitor C7, and a fourth filter capacitor C8. The filter resistors may include a resistor R11, a resistor R12, a resistor R13, and a resistor R14. As shown in FIG. 3, one end of the first filter capacitor C5 is connected to one end of the resistor R11, and the other end of the first filter capacitor C5 is connected to the ground. One end of the second filter capacitor C6 is connected to one end of the resistor R12, and the other end of the second filter capacitor C6 is connected to the ground. One end of the third filter capacitor C7 is connected to one end of the resistor R13, and the other end of the third filter capacitor C7 is connected to the ground. One end of the fourth filter capacitor C8 is connected to one end of the resistor R13, and the other end of the fourth filter capacitor C8 is connected to the ground. The other end of the resistor R11 is connected to the first sampling point AD1. The other end of the resistor R12 is connected to the second sampling point AD2. The other end of the resistor R13 is connected to the third sampling point AD3. The other end of the resistor R14 is connected to the fourth sampling point AD4.

The filter capacitor and the filter resistor form an RC filter circuit, which may filter the sampled data of the sampling point to improve the accuracy of the sampled data collected from the sampling point, thereby improving the accuracy of the thermal runaway detection.

Figure 4:
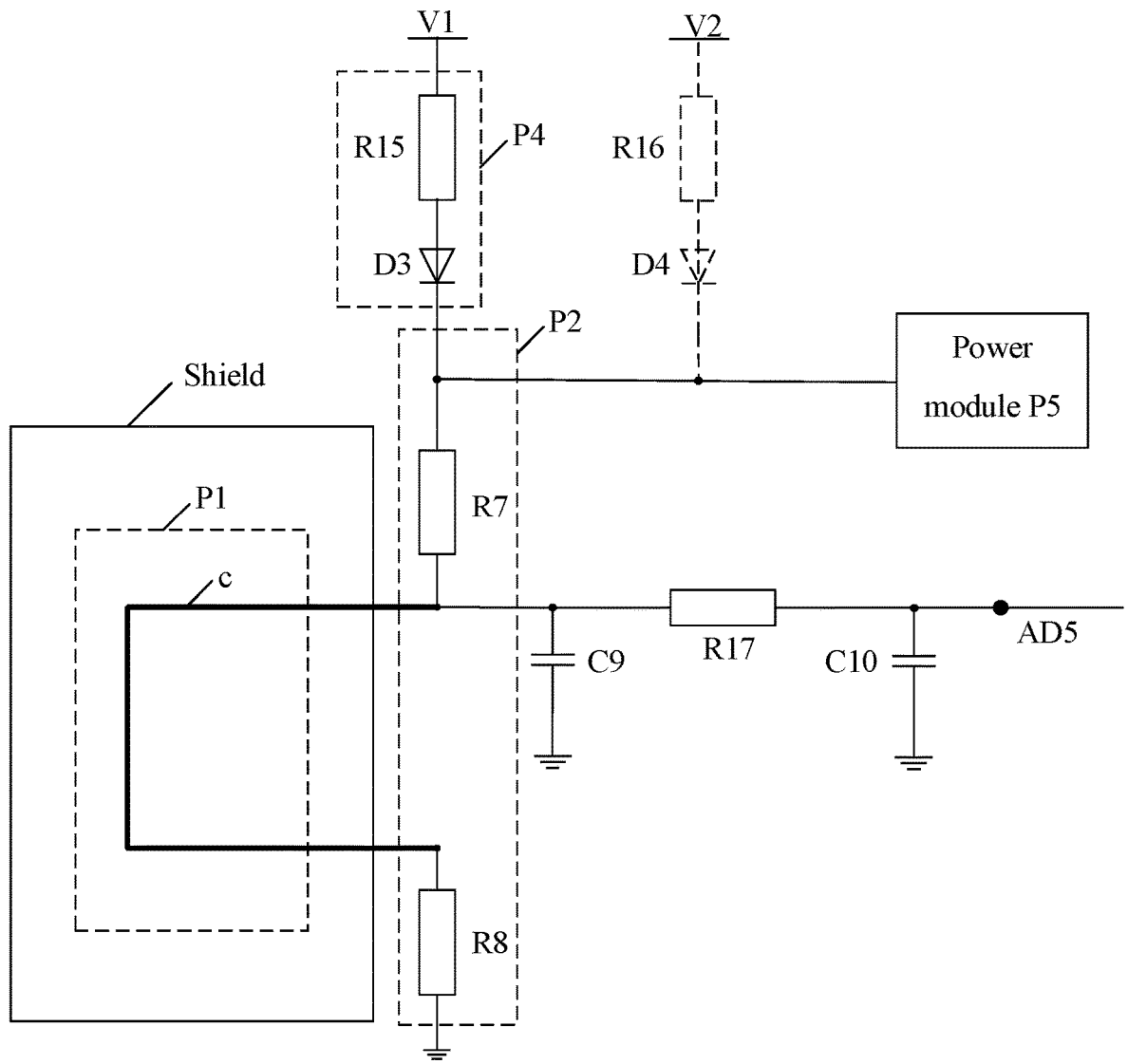
FIG. 4 is a schematic structural diagram of a thermal runaway detection circuit according to yet another embodiment of the present disclosure.

FIG. 4 is a schematic structural diagram of a thermal runaway detection circuit according to still another embodiment of the present disclosure (the processing module P3 is not shown). As shown in FIG. 4, the sensing cable in the sensing module P1 includes a third sensing cable. The detection module P2 includes a set of voltage dividing resistors.

The third sensing cable is disposed in a shield above the battery pack. The number of shields is not limited herein. In some examples, the third sensing cable may be a tin wire or a wire made of other material which is electrically conductive and has a melting point below the melting point threshold. The melting point threshold may be set according to the specific operating scenario and operating requirements, which is not limited herein. The shield may be a mica board, and the third sensing cable, such as a tin wire, may be buried in the mica board.

At least a portion of the third sensing cable is disposed right above the cell explosion-proof valve port of a cell in the battery pack. If thermal runaway occurs in the battery pack, the battery explosion-proof valve will rupture, and high-temperature electrolyte, high-temperature gas, etc. will be ejected from the explosion-proof valve port of the battery pack. At least a part of the third sensing cable is disposed right above the explosion-proof valve port of the cell battery in the battery pack, which may make the third sensing cable more sensitive to the thermal runaway sensing of the battery pack. As a result, As a result, accuracy and timeliness in thermal runaway detection may be further improved.

Further, the third sensing cable may pass right above the explosion-proof valve port of all the cells in the battery pack. The specific arrangement of the third sensing cable may also be determined in combination with an internal structure of the battery pack. For example, the battery pack is a cell pack, the cell pack includes a plurality of battery modules, and a plurality of shields may be disposed in the battery pack. For example, the third sensing cable may include a plurality of sensing cable segments, each of the sensing cable segments is disposed in one of the shields, and each of the sensing cable segments may be connected by another wire harness or a connector or the like.

In an embodiment of the disclosure, the sampling point includes a fifth sampling point.

The above set of voltage dividing resistor set includes a seventh voltage dividing resistor set and an eighth voltage dividing resistor set. The seventh voltage dividing resistor set and the eighth voltage dividing resistor are connected in series through the third sensing cable. One end of the seventh voltage dividing resistor set is connected to the first power supply terminal, and the other end of the seventh voltage dividing resistor set is connected to the other end of the eighth voltage dividing resistor set through the third sensing cable, and one end of the eighth voltage dividing resistor set is connected to the ground. The fifth sampling point is disposed between the seventh voltage dividing resistor set and the eighth voltage dividing resistor set.

In some embodiments, the thermal runaway detection circuit may further include a sleep-wakeup module P4. The connection position and role of the sleep-wakeup module P4 are substantially the same as those of the sleep-wakeup module P4 in the above embodiments, which may be referred to the related description in the above embodiments, and details will not repeated herein.

For example, as shown in FIG. 4, the seventh voltage dividing resistor set includes a resistor R7, and the eighth voltage dividing resistor set includes a resistor R8. The ninth voltage dividing resistor set in the sleep-wakeup module P4 includes a resistor R15. The sleep-wakeup module P4 may also include a diode D3. One end of the resistor R15 is connected to the first voltage terminal V1, and the other end of the resistor R15 is connected to the anode of the diode D3. The cathode of the diode D3 is connected to one end of the resistor R7. The other end of the resistor R7 is connected to the other end of the resistor R8 through a third sensing cable c. One end of the resistor R8 is connected to the ground.

It should be noted that if the BMU is in the operating state, the second power supply terminal continuously provides a wakeup signal to the power module P5 of the BMU. The second power supply terminal is powered up when the BMU is in operating state, thereby ensuring that the wakeup signal is continuously provided to the BMU. The second power supply terminal is powered off when the BMU is in the sleep state, and the sleep-wakeup module P4 wakes up the BMU. As shown in FIG. 4, a resistor R16 may be disposed between the second power supply terminal V2 and the BMU. A diode D4 may also be disposed between the resistor R16 and the power module P5. The anode of the diode D4 is connected to the resistor R16, and the cathode of the diode D4 is connected to the power module P5. Both diode D3 and diode D4 prevent current from flowing back, and the diode D1 and the diode D2 also have a function of competing power supply. For example, if the voltage supplied by the second power supply terminal V2 is higher than the voltage provided by the first power supply terminal V1, the second power supply terminal V2 ensures that the BMU is continuously in the operating state when the BMU is in the operating state.

The related content of the protection capacitor, the filter capacitor, and the filter resistor may be referred to the related description in the above embodiments, and details are not described herein again.

For example, as shown in FIG. 4, the protection capacitor in the detection module P2 includes a fifth protection capacitor C9. The filter capacitor includes a fifth filter capacitor C10. The filter resistor includes a resistor R17. One end of the fifth protection capacitor C9 is connected to one end of the resistor R7 connected to the fifth sampling point AD5, and the other end of the fifth protection capacitor C9 is connected to the ground. One end of the fifth filter capacitor C10 is connected to one end of the resistor R17 and the fifth sampling point AD5, and the other end of the fifth filter capacitor C10 is connected to the ground. The other end of the resistor R17 is connected to the fifth protection capacitor C9.

The processing module P3 is configured to: obtain a fifth sampled data from the fifth sampling point; determine an on-off state of the third sensing cable based on the fifth sampled data; determine whether thermal runaway occurs in the battery pack based on the on-off state of the third sensing cable and the battery pack data.

The on-off state of the third sensing cable includes an open circuit and a non-open circuit (ie, a normal path). The fifth sampled data collected from the fifth sampling point is different in the case where the third sensing cable is open circuited and not open circuited. The on-off state of the third sensing cable may be determined based on the fifth sampled data.

In some examples, a fifth open-circuit threshold range for determining that the third sensing cable is open circuited may be preset. The fifth open-circuit threshold range is related to the voltage supplied by the first power supply terminal. If the thermal runaway detection circuit further includes a sleep-wakeup module P4, the sleep-wakeup module P4 further includes a diode, and the fifth open-circuit threshold range is also related to the diode.

In some examples, a fifth path threshold range for determining that the third sensing cable is in path state may also be preset. The fifth path threshold range is related to the voltage provided by the first power supply terminal, the seventh voltage dividing resistor set, and the eighth voltage dividing resistor set. If the thermal runaway detection circuit further includes a sleep-wakeup module P4, the sleep-wakeup module P4 includes a ninth voltage dividing resistor set, and the fifth path threshold range is also related to the ninth voltage dividing resistor set. If the sleep-wakeup module P4 further includes a diode, the fifth path threshold range is also related to the diode.

The processing module P3 is configured to: determine that the third sensing cable is open circuited when the fifth sampled data is within the fifth open-circuit threshold range; determine that thermal runaway occurs in the battery pack when the third sensing cable is open circuited and at least one parameter of the battery pack data satisfies the fault condition within the preset period. The battery pack data includes at least one parameter.

The parameters in the battery pack data and the fault conditions may be referred to the related description in the above embodiments, and details are not described herein again.

In some examples, the processing module P3 is configured to determine that thermal runaway occurs in the battery pack when the third sensing cable is not open circuited and at least one set of parameters in the battery pack data satisfies the fault condition within the preset period.

A set of parameters includes at least two parameters. At least one set of parameters in the battery pack data and fault conditions may be referred to the related description in the above embodiments, and details are not described herein again.

It should be noted that if the fifth sampled data is neither within the fifth open-circuit threshold nor within the fifth path threshold, it may be determined that there is a fault at the sampling port of the fifth sampling point.

If it is determined that there is a fault at the sampling port of the sampling point, a prompt message about sampling fault may be sent to prompt the vehicle controller to take corresponding measures or prompt the persons related.

In some examples, the processing module P3 may be further configured to send a thermal runaway warning message when it is determined that the third sensing cable is not open circuited and the battery pack data satisfies the fault condition.

The battery pack data includes the maximum voltage of a cell in the battery pack during charging, the actual state of charge of the battery pack during charging, and the charging current of the battery pack during charging. The fault conditions include a parameter that exceed the safety parameter threshold range.

Corresponding to specific parameters in the battery pack data, the safety parameter threshold range includes a voltage safety parameter threshold range, a state of charge safety parameter threshold range, and a current safety parameter threshold range.

That is to say, if it is determined that the third sensing cable is not open circuited, the maximum voltage of a cell in the battery pack during charging exceeds a voltage safety parameter threshold range, the actual state of charge of the battery pack during charging exceeds a state of charge safety parameter threshold range, and the charging current of the battery pack during charging exceeds a current safety parameter threshold range, it may be predicted that thermal runaway is about to occur in the battery pack. The thermal runaway warning message may be sent, so that corresponding measures can be taken in advance to avoid thermal runaway and further improve the safety of the battery pack.

Figure 5:
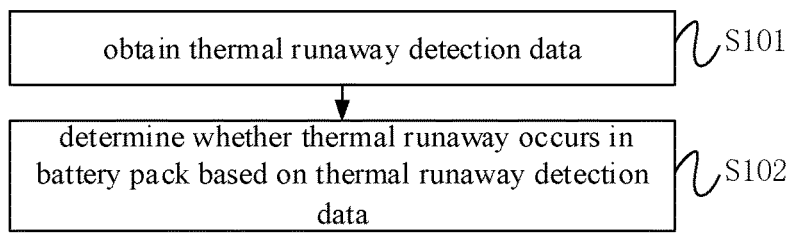
FIG. 5 is a flowchart of a thermal runaway detection method according to an embodiment of the present disclosure.

Corresponding to the thermal runaway detection circuit in the above embodiments, the embodiments of the disclosure further provides a thermal runaway detection method, which may be specifically executed by the processing module. FIG. 5 is a flowchart of a thermal runaway detection method according to an embodiment of the disclosure. As shown in FIG. 5, the thermal runaway detection method may include steps S101 and S102.

In step S101, thermal runaway detection data is acquired.

In step S102, it is determined whether thermal runaway occurs in the battery pack based on the thermal runaway detection data.

The thermal runaway detection data includes battery pack data and sampled data collected from sampling points. The sampling point is disposed between two connected sets of voltage dividing resistors.

In the embodiments of the present disclosure, the sensing module in the thermal runaway detection circuit includes a sensing cable, and the distance between at least a portion of the sensing cable and the cell in the battery pack is less than the temperature sensitive distance threshold, so that the state of the sensing cable can be affected by the temperature of the cell in the battery pack. When the sensing cable is affected by the temperature of the cell, and the on-off state of the sensing cable will change, so that the sampled data collected by the processing module from the sampling point will change. The processing module may determine whether thermal runaway occurs in the battery pack based on the thermal runaway detection data so as to detect the thermal runaway of the battery pack in time. As a result, the safety of the battery pack can be improved.

The specific structure of the thermal runaway detection circuit is different, and the specific implementation of the thermal runaway detection method may also be different.

Figure 6:
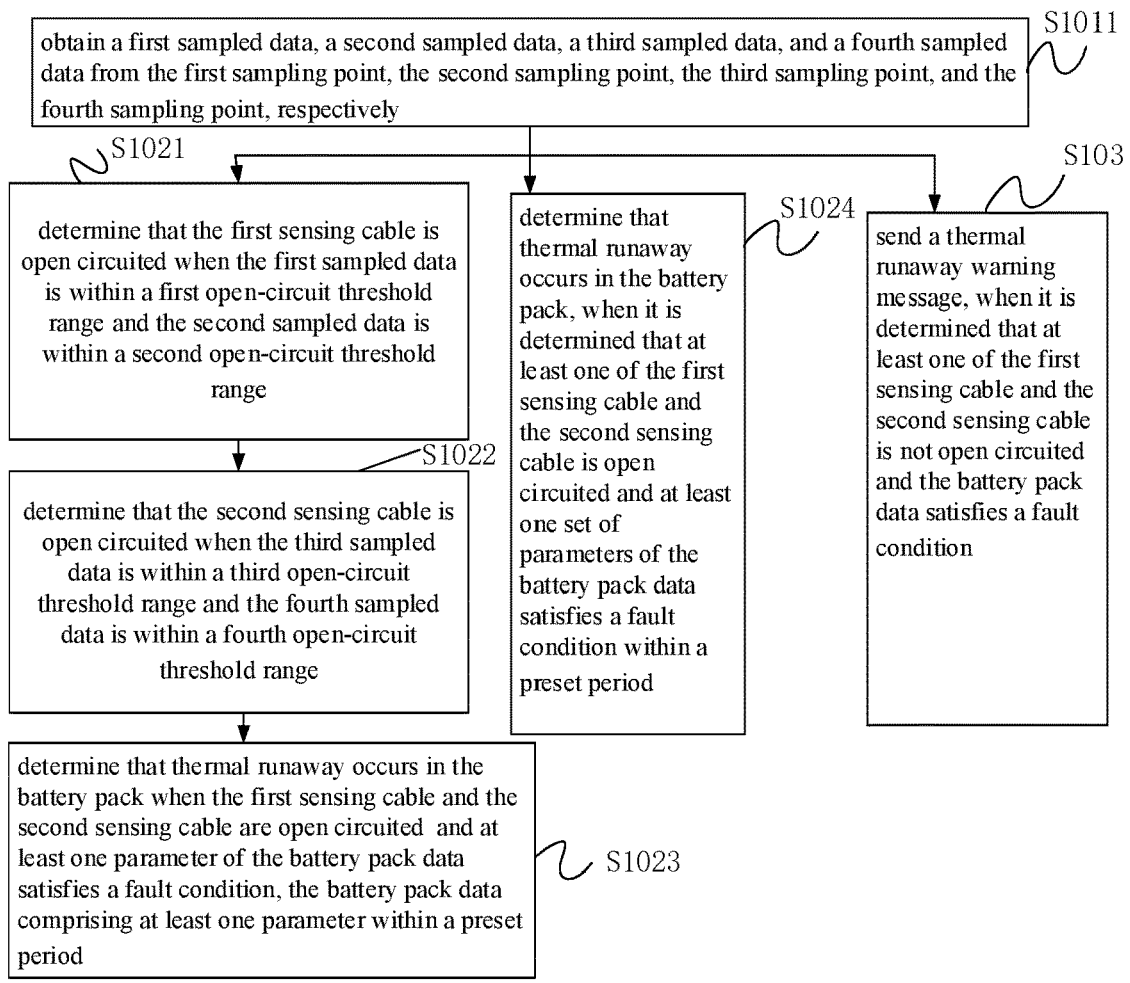
FIG. 6 is a flowchart of a thermal runaway detection method according to another embodiment of the present disclosure.

In some examples, FIG. 6 is a flowchart of a thermal runaway detection method according to another embodiment of the present disclosure. The thermal runaway method may be applied to the thermal runaway detection circuit as shown in FIGS. 2 and 3, and is specifically executed by the processing module. FIG. 6 is different from FIG. 5 in that step S101 of FIG. 5 may be refined to step S1011 of FIG. 6. Step S102 of FIG. 5 may be refined to steps S1021 through S1024 of FIG. 6. The thermal runaway detection method as shown in FIG. 6 may further include step S103.

In step S1011, a first sampled data, a second sampled data, a third sampled data, and a fourth sampled data are respectively acquired from a first sampling point, a second sampling point, a third sampling point, and a fourth sampling point.

The step S102 in the above embodiments may be refined to determine an on-off state of the first sensing cable based on the first sampled data and the second sampled data; determine an on-off state of the second sensing cable based on the third sampled data and the fourth sampled data; determine whether thermal runaway occurs in the battery pack based on the on-off state of the first sensing cable, the on-off state of the second sensing cable, and the battery pack data.

In step S1021, if the first sampled data is within the first open-circuit threshold range and the second sampled data is within the second open-circuit threshold range, it is determined that the first sensing cable is open circuited.

In step S1022, if the third sampled data is within the third open-circuit threshold range and the fourth sampled data is within the fourth open-circuit threshold range, it is determined that the second sensing cable is open circuited.

In step S1023, if the first sensing cable and the second sensing cable are both open circuited, and at least one parameter in the battery pack data satisfies a fault condition within the preset period, it is determined that thermally runaway occur in the battery pack.

The battery pack data includes at least one parameter.

In step S1024, if it is determined that at least one of the first sensing cable and the second sensing cable is not open circuited, and at least one set of parameters in the battery pack data satisfies a fault condition within the preset period, it is determined that thermal runaway occurs in the battery pack.

A set of parameters includes at least two parameters.

In step S103, if it is determined that at least one of the first sensing cable and the second sensing cable is not open circuited, and the battery pack data satisfies the fault condition, a thermal runaway warning message may be sent.

The battery pack data includes the maximum voltage of a cell in the battery pack during charging, the actual state of charge of the battery pack during charging, and the charging current of the battery pack during charging. The fault conditions may include a parameter that exceed a safety parameter threshold range.

Figure 7:
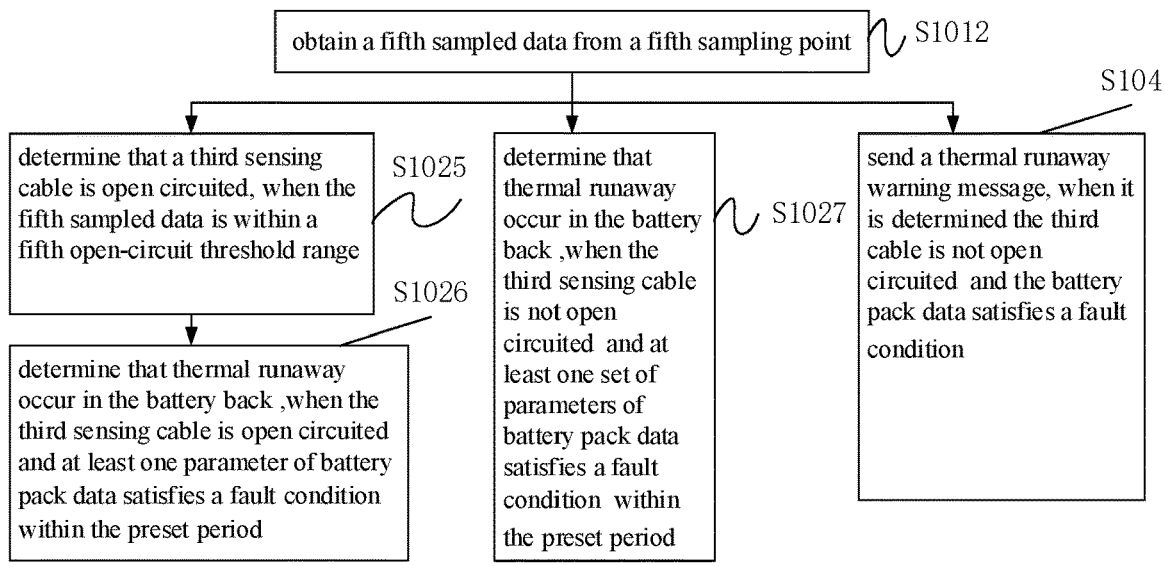
FIG. 7 is a flowchart of a thermal runaway detection method according to still another embodiment of the present disclosure.

In other examples, FIG. 7 is a flowchart of a thermal runaway detection method according to yet another embodiment of the present disclosure. The thermal runaway detection method may be applied to the thermal runaway detection circuit as shown in FIG. 4, and is specifically executed by the processing module. FIG. 7 is different from FIG. 5 in that step S101 of FIG. 5 may be refined to step S1012 of FIG. 7. Step S102 of FIG. 5 may be refined to step S1025 to step S1027 of FIG. 7. The thermal runaway detection method as shown in FIG. 7 may further include step S104.

In step S1012, the fifth sampled data is acquired from the fifth sampling point.

The step S102 may be refined to determine an on-off state of the third sensing cable based on the fifth sampled data; and determine whether thermal runaway occurs in the battery pack based on the on-off state of the third sensing cable and the battery pack data.

In step S1025, if the fifth sampled data is within the fifth open-circuit threshold range, it is determined that the third sensing cable is open circuited.

In step S1026, if the third sensing cable is open circuited, and at least one parameter in the battery pack data satisfies a fault condition within the preset period, it is determined that thermal runaway occurs in the battery pack.

The battery pack data includes at least one parameter.

In step S1027, if it is determined that the third sensing cable is not open circuited, and at least one set of parameters in the battery pack data satisfies a fault condition within the preset period, it is determined that thermal runaway occurs in the battery pack.

A set of parameters includes at least two parameters.

In step S104, if it is determined that the third sensing cable is not open circuited and the battery pack data satisfies a fault condition, a thermal runaway warning message is sent.

The battery pack data includes the maximum voltage of a cell in the battery pack during charging, the actual state of charge of the battery pack during charging, and the charging current of the battery pack during charging. The fault conditions may include a parameters that exceed a safety parameter threshold range.

In the above two examples, if the sensing cable is open circuited, and at least one parameter in the battery pack data satisfies a fault condition, it is determined that thermal runaway occurs in the battery pack, the battery pack data includes one or more of the following parameters:

a maximum temperature of a cell in the battery pack, a temperature change rate of a cell in the battery pack, a difference between the maximum temperature and a minimum temperature of a cell in the battery pack, a minimum voltage of a cell in the battery pack, a number of voltage sampling open-circuit faults of the battery pack, a temperature sensing failure parameter, and a cell monitoring communication failure parameter.

The maximum temperature of the cell in the battery pack, the temperature change rate of the cell in the battery pack, the difference between the highest temperature and the lowest temperature of the cell in the battery pack, the minimum voltage of the cell in the battery pack, The number of voltage sampling and open-circuit faults of the battery pack, the temperature sensitive failure parameters, and the battery monitoring communication failure parameters.

The fault condition may include a parameter exceeding a safety parameter threshold range or a parameter characterizing a failure.

In the above two examples, if not all of the sensing cables are open circuited, and at least one set of parameters in the battery pack data satisfies the fault condition, it is determined that thermal runaway occurs in the battery pack, the set of parameters includes any of the following sets of parameters.

The set of parameters may include at least two parameters. The set of parameters may include any of the following sets of parameters: the minimum voltage of a cell in the battery pack, and the maximum temperature of a cell in the battery pack; the minimum voltage of a cell in the battery pack, and the temperature change rate of a cell in the battery pack; the minimum voltage of a cell in the battery pack, and the difference between the maximum temperature of a cell in the battery pack and the minimum temperature of a cell in the battery pack; the temperature change rate of a cell in the battery pack, and the maximum temperature of a cell in the battery pack; the temperature change rate of a cell in the battery pack, and the difference between the maximum temperature of a cell in the battery pack and the minimum temperature of a cell in the battery pack; the number of voltage sampling open-circuit faults of the battery pack, and the maximum temperature of a cell in the battery pack; the number of voltage sampling open-circuit faults of the battery pack, and the temperature change rate of a cell in the battery pack; the number of voltage sampling open-circuit faults of the battery pack, and the difference between the maximum temperature of a cell in the battery pack and the minimum temperature of a cell in the battery pack; and the number of voltage sampling open-circuit faults of the battery pack, and the temperature sensing failure parameter.

The fault condition may include a parameter exceeding the safety parameter threshold range or a parameter characterizing a failure.

In some examples, when the thermal runaway detection circuit further includes a sleep-wakeup module, the above thermal runaway detection method may further include the step of the sleep-wakeup module sending a control signal to the power module of the battery management unit if the battery management unit is in a sleep state. The control signal is used to instruct the power module to control the battery management unit to remain in the sleep state or switch to an operating state.

In some examples, the above thermal runaway detection method may further include the step of the processing module sending an alarm signal to the vehicle controller when it is determined that that thermal runaway occurs in the battery pack.

It should be noted that details for the steps of the thermal runaway detection method may refer to the related description in the embodiments of the thermal runaway detection circuit, which are not described herein again.

An embodiment of the present disclosure further provides a computer readable storage medium storing computer programs thereon, which, when executed by a processor(s), may implement the thermal runaway detection method in the above embodiments.

The embodiments of the above examples may be implemented in various ways and should not be construed as being limited to the embodiments set forth herein. Furthermore, the features, structures, or characteristics described in the above embodiments may be combined in one or more embodiments in any suitable manner. However, those skilled in the art will appreciate that the technical solution of the present disclosure may be practiced without one or more of the specific details, or by employing other methods, components, materials, and the like. In other cases, well-known structures, material, or operations are not shown or described in detail to avoid obscuring the main technical ideas of the present disclosure.

It is to be understood that various embodiments in the specification are described in a progressive manner. The same or similar parts between the various embodiments may be referred to each other, and each embodiment focuses on a different part from other embodiments. For method embodiments, reference may be made to the description for the circuit embodiments. The disclosure is not limited to the specific steps and structures described above and illustrated in the drawings. A person skilled in the art may make various changes, modifications and additions, or change the order between the steps after understanding the spirit of the disclosure. Also, a detailed description of known techniques is omitted herein for the sake of brevity.

Those skilled in the art should understand that the above embodiments are exemplary rather than limitative. Different technical features in different embodiments may be combined to obtain beneficial effects. Other variations of the described embodiments can be understood and practiced by those skilled in the art upon studying the drawings, the specification and the claims herein. In the claims, the term "comprising" does not exclude other means or steps; the indefinite article "a" does not exclude a plurality of; the terms "first", "second" are used to illustrate names rather than to indicate any particular order. Any reference numerals in the claims should not be construed as limiting the scope of protection. The functions of the various parts in the claims may be implemented by a single hardware or software module. The presence of certain features in different dependent claims does not indicate that these technical features cannot be combined to achieve beneficial effects.

What is claimed is:

1. A thermal runaway detection circuit, characterized by comprising:

a sensing module including a sensing cable, wherein a distance between at least a portion of the sensing cable and a cell of a battery pack is less than a temperature sensitive distance threshold;

a detection module connected to the sensing cable and including at least one set of voltage dividing resistors, wherein one end of each set of voltage dividing resistors is connected to a first power supply terminal, and the other end of each set of voltage dividing resistors is connected to the ground, and each set of voltage dividing resistors includes at least two voltage dividing resistor sets connected in series;

a processing module connected to the detection module, wherein the processing module is configured to obtain thermal runaway detection data, and determine whether thermal runaway occurs in the battery pack based on the thermal runaway detection data, wherein the thermal runaway detection data includes battery pack data and sampled data collected from sampling points, and the sampling points are disposed between the two connected voltage dividing resistor sets, wherein the sensing cable includes a first sensing cable and a second sensing cable disposed on a circuit board above the battery pack, at least a portion of the first sensing cable and at least a portion of the second sensing cable are disposed right above a cell explosion-proof valve port of the cell of the battery pack.

2. The thermal runaway detection circuit of claim 1, wherein the detection module includes two sets of voltage dividing resistors, the sampling points include a first sampling point, a second sampling point, a third sampling point, and a fourth sampling point;

wherein a first set of voltage dividing resistors includes a first voltage dividing resistor set, a second voltage dividing resistor set, and a third voltage dividing resistor set connected in series, one end of the first voltage dividing resistor set is connected to the first power supply terminal, one end of the third voltage dividing resistor set is connected to the ground, the first sampling point is disposed between the first voltage dividing resistor set and the second voltage dividing resistor set, the second sampling point is disposed between the second voltage dividing resistor set and the third voltage dividing resistor set, one end of the first sensing cable is connected to the first sampling point, and the other end of the first sensing cable is connected to the second sampling point; and wherein the second set of voltage dividing resistors includes a fourth voltage dividing resistor set, a fifth voltage dividing resistor set and a sixth voltage dividing resistor set connected in series, one end of the fourth voltage dividing resistor set is connected to the first power supply terminal, one end of the sixth voltage dividing resistor set is connected to the ground, the third sampling point is disposed between the fourth voltage dividing resistor set and the fifth voltage dividing resistor set, the fourth sampling point is disposed between the fifth voltage dividing resistor set and the sixth voltage dividing resistor set, one end of the second sensing cable is connected to the third sampling point, and the other end of the second sensing cable is connected to the fourth sampling point.

3. The thermal runaway detection circuit of claim 2, wherein the processing module is configured to:
obtain a first sampled data, a second sampled data, a third sampled data, and a fourth sampled data from the first sampling point, the second sampling point, the third sampling point, and the fourth sampling point, respectively;
determine an on-off state of the first sensing cable based on the first sampled data and the second sampled data;
determine an on-off state of the second sensing cable based on the third sampled data and the fourth sampled data; and
determine whether thermal runaway occurs in the battery pack based on the on-off state of the first sensing cable, the on-off state of the second sensing cable, and the battery pack data.

4. A thermal runaway detection method for the thermal runaway detection circuit of claim 3, wherein the thermal runaway detection method comprises:
obtaining, by the processing module, a first sampled data, a second sampled data, a third sampled data, and a fourth sampled data from the first sampling point, the second sampling point, the third sampling point, and the fourth sampling point, respectively;
determining, by the processing module, an on-off state of the first sensing cable based on the first sampled data and the second sampled data;
determining, by the processing module, an on-off state of the second sensing cable based on the third sampled data and the fourth sampled data; and
determining, by the processing module, whether thermal runaway occurs in the battery pack based on the on-off state of the first sensing cable, the on-off state of the second sensing cable, and the battery pack data.

5. The thermal runaway detection circuit of claim 3, wherein the processing module is configured to:

determine that the first sensing cable is open circuited when the first sampled data is within a first open-circuit threshold range and the second sampled data is within a second open-circuit threshold range;
determine that the second sensing cable is open circuited when the third sampled data is within a third open-circuit threshold range and the fourth sampled data is within a fourth open-circuit threshold range; and
determine that thermal runaway occurs in the battery pack when the first sensing cable and the second sensing cable are open circuited and at least one parameter of the battery pack data satisfies a fault condition within a preset period, the battery pack data comprising the at least one parameter.

6. The thermal runaway detection circuit of claim 5, wherein the battery pack data comprises one or more of:
a maximum temperature of a cell in the battery pack, a temperature change rate of a cell in the battery pack, a difference between the maximum temperature and a minimum temperature of a cell in the battery pack, a minimum voltage of a cell in the battery pack, a number of voltage sampling open-circuit faults of the battery pack, a temperature sensing failure parameter, and a cell monitoring communication failure parameter,
wherein the fault condition includes a parameter exceeding a safety parameter threshold range or a parameter characterizing a failure.

7. The thermal runaway detection circuit of claim 5, wherein the processing module is configured to:
determine that thermal runaway occurs in the battery pack, when it is determined that at least one of the first sensing cable and the second sensing cable is not open circuited and at least one set of parameters of the battery pack data satisfies a fault condition within a preset period, the set of parameters comprising at least two parameters.

8. The thermal runaway detection circuit of claim 7, wherein the set of parameters comprises any set of the following sets of parameters:
a minimum voltage of a cell in the battery pack, and a maximum temperature of a cell in the battery pack;
the minimum voltage of a cell in the battery pack, and a temperature change rate of a cell in the battery pack;
the minimum voltage of a cell in the battery pack, and a difference between the maximum temperature of a cell in the battery pack and a minimum temperature of a cell in the battery pack;
the temperature change rate of a cell in the battery pack, and the maximum temperature of a cell in the battery pack;
the temperature change rate of a cell in the battery pack, and the difference between the maximum temperature of a cell in the battery pack and the minimum temperature of a cell in the battery pack;
a number of voltage sampling open-circuit faults of the battery pack, and the maximum temperature of a cell in the battery pack;
the number of voltage sampling open-circuit faults of the battery pack, and the temperature change rate of a cell in the battery pack;
the number of voltage sampling open-circuit faults of the battery pack, and the difference between the maximum temperature of a cell in the battery pack and the minimum temperature of a cell in the battery pack; and
the number of voltage sampling open-circuit faults of the battery pack, and a temperature sensing failure parameter, wherein the fault condition includes a parameter exceeding a safety parameter threshold range or a parameter characterizing a failure.

9. The thermal runaway detection circuit of claim 7, wherein the processing module is further configured to:
send a thermal runaway warning message, when it is determined that at least one of the first sensing cable and the second sensing cable is not open circuited and the battery pack data satisfies a fault condition,
wherein the battery pack data includes a maximum voltage of a cell in the battery pack during charging, an actual state of charge of the battery pack during charging, and a charging current of the battery pack during charging; and
wherein the fault condition includes a parameter exceeding a safety parameter threshold range.

10. The thermal runaway detection circuit of claim 1, wherein the sensing cable includes a third sensing cable disposed in a shield above the battery pack, and at least a portion of the third sensing cable is disposed right above a cell explosion-proof valve port of the cell of the battery pack.

11. The thermal runaway detection circuit of claim 10, wherein the third sensing cable is a tin wire and the shield is a mica board.

12. The thermal runaway detection circuit of claim 10, wherein the detection module comprises a set of voltage dividing resistors, and the sampling points includes a fifth sampling point; and
wherein the set of voltage dividing resistors includes a seventh voltage dividing resistor set and an eighth voltage dividing resistor set connected in series through the third sensing cable, one end of the seventh voltage dividing resistor set is connected to the first power supply terminal, one end of the eighth voltage dividing resistor set is connected to the ground, and the fifth sampling point is disposed between the seventh voltage dividing resistor set and the eighth voltage dividing resistor set.

13. The thermal runaway detection circuit of claim 10, wherein the processing module is configured to:
obtain a fifth sampled data from the fifth sampling point;
determine an on-off state of the third sensing cable based on the fifth sampled data;
determine whether thermal runaway occurs in the battery pack based on the on-off state of the third sensing cable and the battery pack data.

14. The thermal runaway detection circuit of claim 13, wherein the processing module is configured to:
determine that the third sensing cable is open circuited when the fifth sampled data is within a fifth open-circuit threshold range;
determine that thermal runaway occurs in the battery pack when the third sensing cable is open circuited and at least one parameter of the battery pack data satisfies a fault condition within a preset period, the battery pack data comprising the at least one parameter.

15. The thermal runaway detection circuit of claim 14, wherein the processing module is configured to:
determine that thermal runaway occurs in the battery pack when the third sensing cable is not open circuited and at least one set of parameters of the battery pack data satisfies a fault condition within a preset period, the set of parameters comprising at least two parameters.

16. The thermal runaway detection circuit of claim 14, wherein the processing module is further configured to:
send a thermal runaway warning message, when it is determined that the third sensing cable is not open circuited and the battery pack data satisfies a fault condition,
wherein the battery pack data includes a maximum voltage of a cell in the battery pack during charging, an actual state of charge of the battery pack during charging, and a charging current of the battery pack during charging; and
wherein the fault condition includes a parameter exceeding a safety parameter threshold range.

17. The thermal runaway detection circuit of claim 1, further comprising:
a sleep-wakeup module disposed between the first power supply terminal and all sets of voltage dividing resistors, and the sleep-wakeup module is configured to send a control signal to a power module of the battery management unit when the battery management unit is in a sleep state,
wherein the control signal is configured to instruct the power module to control the battery management unit to remain in the sleep state or switch to an operating state.

18. The thermal runaway detection circuit of claim 17, wherein:
the sleep-wakeup module includes a ninth voltage dividing resistor set, or
the sleep-wakeup module includes a ninth voltage dividing resistor set and a diode, an anode of the diode is connected to the ninth voltage dividing resistor set, and a cathode of the diode is connected to the power module.

19. The thermal runaway detection circuit of claim 1, wherein:
the detection module further includes a protection capacitor, one end of the protection capacitor is connected to one end of a voltage dividing resistor set connected to a sampling point, and the other end of the protection capacitor is connected to the ground,
the detection module further includes a filter capacitor and a filter resistor, one end of the filter capacitor is connected to one end of the filter resistor and the sampling point, and the other end of the filter capacitor is connected to the ground, and the other end of the filter resistor is connected to one end of the protection capacitor.

* * * * *